United States Patent
Pham (10) Patent No.: US 7,918,378 B1
(45) Date of Patent: Apr. 5, 2011

(54) WIRE BONDING DEFLECTOR FOR A WIRE BONDER

(75) Inventor: Ken Pham, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/851,981

(22) Filed: Aug. 6, 2010

(51) Int. Cl.
*B23K 37/00* (2006.01)
(52) U.S. Cl. .......................... 228/4.5; 228/15.1; 228/904
(58) Field of Classification Search ............... 228/180.5, 228/4.5, 904, 15.1
See application file for complete search history.

(56) References Cited

U.S. PATENT DOCUMENTS

| | | | | |
|---|---|---|---|---|
| 3,289,452 A | * | 12/1966 | Hartwig | 72/324 |
| 3,750,926 A | * | 8/1973 | Sakamoto et al. | 228/1.1 |
| 4,030,657 A | * | 6/1977 | Scheffer | 228/1.1 |
| 4,594,493 A | * | 6/1986 | Harrah et al. | 219/56.22 |
| 4,667,867 A | * | 5/1987 | Dobbs et al. | 228/44.7 |
| 4,776,509 A | * | 10/1988 | Pitts et al. | 228/179.1 |
| 5,558,270 A | * | 9/1996 | Nachon et al. | 228/180.5 |
| 5,816,472 A | * | 10/1998 | Linn | 228/1.1 |
| 5,899,375 A | * | 5/1999 | Yoshida et al. | 228/4.5 |
| 6,267,290 B1 | * | 7/2001 | Murdeshwar | 228/180.5 |
| 6,564,989 B2 | * | 5/2003 | Arakawa | 228/180.5 |
| 6,708,403 B2 | * | 3/2004 | Beaman et al. | 29/843 |
| 6,896,170 B2 | * | 5/2005 | Lyn et al. | 228/4.5 |
| 7,216,794 B2 | * | 5/2007 | Lange et al. | 228/180.1 |
| 7,249,702 B2 | * | 7/2007 | Mironescu et al. | 228/4.5 |
| 2002/0117330 A1 | * | 8/2002 | Eldridge et al. | 174/260 |
| 2006/0273140 A1 | * | 12/2006 | Ghosh | 228/112.1 |

FOREIGN PATENT DOCUMENTS

| | | | | |
|---|---|---|---|---|
| JP | 54005383 A | * | 1/1979 | |
| JP | 54152962 A | * | 12/1979 | |
| JP | 04206841 A | * | 7/1992 | |
| JP | 07147296 A | * | 6/1995 | |
| JP | 10056034 A | * | 2/1998 | |
| JP | 2000012598 | * | 1/2000 | |

* cited by examiner

*Primary Examiner* — Kiley Stoner
*Assistant Examiner* — Carlos Gamino
(74) *Attorney, Agent, or Firm* — Beyer Law Group LLP (57) ABSTRACT

Methods and systems are described for enabling the efficient fabrication of wedge-bonding of integrated circuit systems and electronic systems.

16 Claims, 9 Drawing Sheets

WIRE BONDING DEFLECTOR FOR A WIRE BONDER

TECHNICAL FIELD

The present invention relates generally to semiconductor device packaging and interconnection technologies. In particular wedge bonding technologies are discussed. More particularly, apparatus, methods, software, hardware, and systems are described for achieving high-speed wedge bonding of wire bonds.

BACKGROUND OF THE INVENTION

In the field of semiconductor packaging, wire bonding can be used to interconnect integrated circuits and other associated components together. In particular, two main modes of wire bonding are in common usage. Ball bonding and wedge bonding. Both methods are well known in the art and have been in use for many years. As is known, ball bonding is commonly known and is frequently used with gold materials. However gold is relatively expensive. Additionally, such gold ball bonding requires surface plating (for example using silver) and heat to maintain good adhesion to bond pad materials. Additionally, attempts have been made to use ball bonding with copper materials. However, at the high temperatures required for copper ball formation oxide formation is a common problem. The problem is quite pronounced as copper oxides are insulating materials that have proven difficult to bond. Additionally, deformation of the electrical connections made at high temperatures lead to reliability issues. Methods of avoiding oxide formation require the use of oxygen free ambient conditions. This comes with its own set of problems. Similar oxide formation issues make aluminum a difficult material for ball bonding applications as well. An advantage to ball bonding is its high rate of processing speed. In many applications, average bonding speeds of the order of 12-14 bonds per second can be attained.

However, because some materials are difficult to work with using high temperature ball bonding, an alternative wedge bonding approach can be used. A disadvantage of such prior art wedge bonding technique is that it is a comparatively slow process with average bonding speeds of the order of 2-3 bonds per second being common.

Moreover, although ball bonding and wedge bonding have been used in the industry for many years, wedge bonding has up until this point been a relatively slow process even after 30 years of use. Accordingly, ways of improving wedge bonding speeds would be advantageous. Thus, while existing systems and methods work well for many applications, there is an increasing demand for wedge bonding methodologies that enable increased speed using a variety of materials including aluminum. This disclosure addresses some of those needs.

SUMMARY OF THE INVENTION

In a first aspect, an embodiment of the invention describes method for high-speed wired bonding. The method involves positioning a distal end of a wire-bonding capillary near a first bonding site. Extruding a length of bonding wire from an aperture in the end of the capillary. Imposing a movable deflector against the extruded length of bonding wire to bend the bonding wire to form a bent portion at an end of the bonding wire. Moving the bent portion of the bonding wire into contact with first bonding site. Wedge bonding the bent portion of the bonding wire with the first bonding site. In one approach, the wedge bonding can comprise, compressing and/or ultra-sonic bonding the bent portion of the bonding wire between the bonding site and a facing surface of the capillary and ultrasonically bonding the bent portion of the bonding wire to the first bonding site. To further continue an example method, the capillary can be moved away from the first bonding site toward a second bonding site where another end of the bonding wire is wedge bonded to the second bonding site to establish a wire bond connection between the first and second bonding sites.

In another aspect, embodiments of the invention include a wire bonding apparatus comprising a support for holding wire bonding substrates, a wire bonding capillary with an aperture for carrying and extruding bond wire and enabling bond wire attachment to wire bonding substrates, a movable deflector element arranged to enable movement of the deflector element to bend an extruded length of bonding wire such that the bent extruded length of bonding wire can be articulated at different bond line angles while maintaining a constant rotational orientation for the capillary, and a controller configured to enable control the operation of the wire bonding apparatus.

In another aspect, embodiments of the invention describe a movable deflector element module for use in wire bonding operations. One such module includes a deflection member configured to enable movement in an x axis and y axis direction. The member includes an aperture oriented in a z-axis with the aperture having inner wall that defines a wire contact surface having a plurality of wire guide features. Also, a deflection actuator is configured to move the deflection member in said x and y axis directions as directed by a control element configured to specify x and y axis movement for the deflection actuator.

In another aspect, embodiments of the invention describe a capillary element for use in high speed wire bonding operations. One such capillary comprises a capillary including a facing surface at a tip end of the capillary. Also including an aperture that penetrates through the capillary to an opening in the facing surface of the shaft to enable a bond wire to pass through the aperture exiting the opening in the facing surface. The facing surface defines a substantially ring-shaped roughened surface area with a substantially flat surface angled in a range of about 0° to about 4°.

General aspects of the invention include, but are not limited to methods, systems, apparatus, and computer program products for enabling improved high speed wedge bonding of wire bonds.

BRIEF DESCRIPTION OF THE DRAWINGS

The invention and the advantages thereof may best be understood by reference to the following description taken in conjunction with the accompanying drawings in which:

FIGS. 4(a)-4(g) are a set of illustrations illustrating one example process embodiment of using a wedge bonding tool in accordance with the principles of the present invention in conjunction with a deflector element to form directional wire bonds used for connecting IC elements with external connectors such a lead frames.

FIG. 4(h) shows an example of a bond angle and an alignment approach for one embodiment of wedge bonding in accordance with the principles of the invention.

In the drawings, like reference numerals are sometimes used to designate like structural elements. It should also be appreciated that the depictions in the figures are diagrammatic and not to scale.

DETAILED DESCRIPTION OF PREFERRED EMBODIMENTS

Reference is made to particular embodiments of the invention. Examples of which are illustrated in the accompanying drawings. While the invention will be described in conjunction with particular embodiments, it will be understood that it is not intended to limit the invention to the described embodiments. To contrary, the disclosure is intended to extend to cover alternatives, modifications, and equivalents as may be included within the spirit and scope of the invention as defined by the appended claims.

Aspects of the invention pertain to methods and apparatus for enabling high speed wedge bonding in semiconductor wire bonding applications.

Figure 1A:
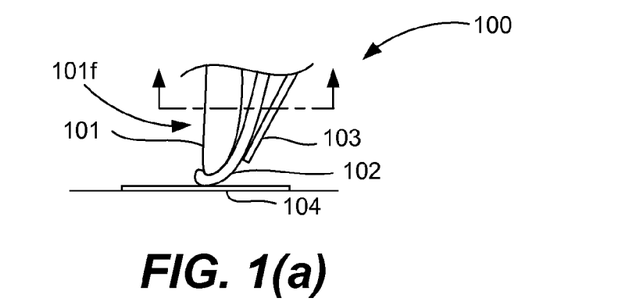
FIGS. 1(a) and 1(b) are views of a prior art wedge bonding bond head as shown in side and top section view.
Figure 1B:
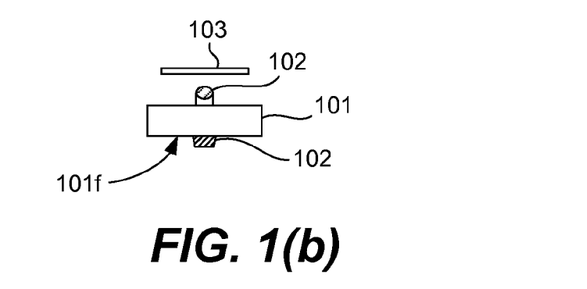
Figure 1C:
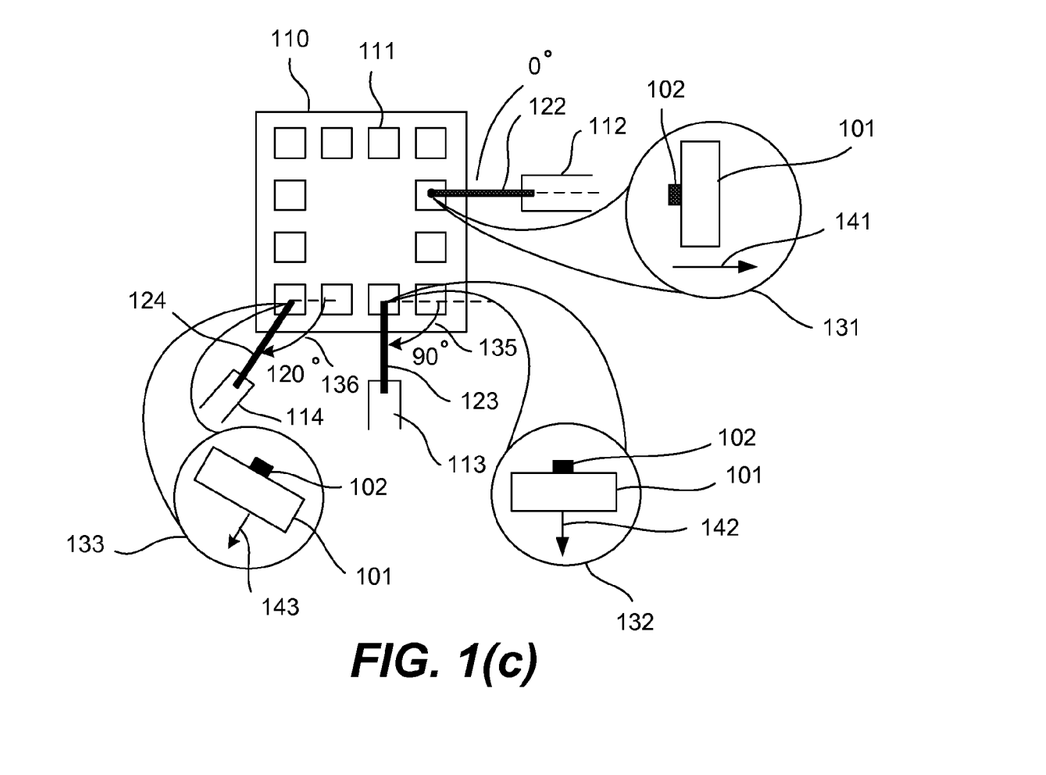
FIG. 1(c) is a top down diagrammatic view of a prior art bonding tool showing the changing rotational orientation of the wedge bonding tool as it progresses around a die forming a series of wire bonds.

The diagrammatic illustrations of FIGS. 1(a)-1(c) provide an understanding of some of the problems inherent in state of the art wedge bonding technologies. FIG. 1(a) is a diagrammatic side view of a portion of a wedge bonding tool 100. A bond head 101 feeds a bonding wire 102 downward and can use a guide 103 to help position the wire 102 in desired proximity to a bond pad 104. When the bond head 101 is moved in a direction toward the bond pad 104 and downward pressure is applied against the bond pad 104 and the wire 102 and typically ultrasonic energy is applied to the wire 102 to bond the wire 102 to the pad 104. The tool 100 lifts the bond head 101 and moves it to an associated lead (or other bonding site) that is to be connected with the bond pad 104 by a wire bond. The wire is then typically broken off to complete the wire bond between the two bonding pads.

FIGS. 1(a) and 1(b) illustrate a facing surface 101f of the bond head 101. FIG. 1(b) is a top down section view of the bond head 101 of FIG. 1(a). The wire 102 runs under the bond head 101. In particular, this view shows that during wedge bonding the head move 105 in a direction toward the eventual other end of the wire bond connection (i.e., the other bonding surface). Thus, the motion of the wire and head is essentially a straight line motion between the first bonding site and the target bonding site.

As shown in FIG. 1(c), it is this straight line motion between beginning bond pad bonding site and target bond location that defines a "bond line" between the two locations. FIG. 1(c) presents a simplified top down view of an integrated circuit die 110 and bond connections to external contacts. As shown here the die 110 includes a plurality of bond pads 111 arranged around a top surface of the die 110. Also shown are a few of the many electrical connectors (112-114) arranged around the circumference of the die 110.

In examining a first wire bond connection 122 connecting one of the pads 111 with a first external connector 112 the wire bond 122 defines a bond line between the two contact locations. Here we arbitrarily identify the bond line 122 as having angle of 0°. The diagrammatic illustration includes a first bubble 131 that shows a top down view of the associated bond head 101 and the bond wire 102. During wedge bonding, the bond head is moved in direction 141 from the bond pad 111 toward the final bonding site at connector 112. In the wedge bonding process, this process is repeated for each pair of pads and contact for the die 110. Thus, the bonding proceeds around the circumference of the die until completed.

For example, as the process has moved clockwise around the die another wire bond 123 is briefly discussed. A second external bond site 113 is wire bonded with an associated one of the pads 111 thereby defining the wire bond 123 and its associated bond line. With reference to the first bond line (122) it is shown that the bond angle has changed. Here that angle change 135 is represented as 90°. Thus the bond line 123 lies at 90° from the first bond line 122. This has consequences in how the wire bond is formed. The diagrammatic illustration includes a second bubble 132 that shows a top down view of the associated of the same bond head 101 and a bond wire 102. Because the bond line is significantly changed, the rotational orientation of the bond head 101 must also significantly rotate. This rotation enables wedge bonding between the external bond site 113 and its associated bond pad. During wedge bonding, the bond head 101 is moved in second direction 142 from the bond pad 111 toward the final bonding site at connector 113.

Likewise, as the process continues moving clockwise around the die another wire bond 124 is briefly discussed. Here, an example third external bond site 114 is shown wire bonded with an associated one of the pads 111 thereby defining the wire bond 124 and its associated bond line. With reference the to the first bond line (122), it is shown here that the bond angle 136 has further to about 120°. Thus the bond line 124 lies at 90° from the first bond line 122. Again, this has consequences in how the wire bond is formed. The diagrammatic illustration includes a third bubble 133 that shows a top down view of the associated of the same bond head 101 and a bond wire 102. Because the bond line is again significantly changed, the rotational orientation of the bond head 101 must also significantly rotate. At this point the rotation is about 120 degrees. Also, as before, this rotation enables wedge bonding between the external bond site 114 and its associated bond pad. During wedge bonding, the bond head 101 is moved in third direction 143 from the bond pad 111 toward the final bonding site at connector 114. And so it continues until the die 110 is completely bonded.

It is very important to consider that the bond head 101 realignment process takes a considerable amount of time. In fact, it is what accounts for the majority of the disparity in bond rates between the ball bonding process (e.g., about 14 bonds/s) and the prior art wedge bonding process (e.g., about 2-3 bonds/s). Accordingly, an approach for removing this step from the process has considerable advantage in a wedge bonding process.

Figure 2:
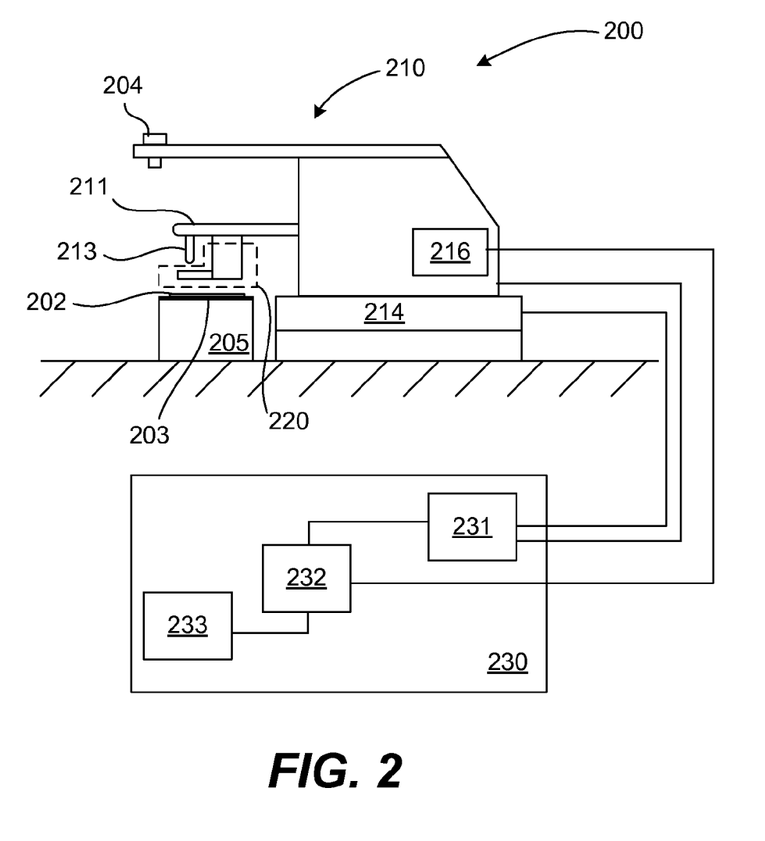
FIG. 2 is a block diagram illustrating an example wedge bonding apparatus in accordance with the principles of the present invention.

Accordingly, FIG. 2 is a block diagram describing a novel wedge bonding apparatus 200 in accordance with one embodiment of the invention. Several of the many listed components are optional or can be substituted for other elements. The apparatus includes a wedge bonding module 210 arranged to enable wedge bonding of an IC chip 202 to another substrate during a wedge bonding process. The wedge bonding module includes a control arm 211, an associated wire bonding capillary 213, and a deflector module 220 arranged to enable deflection of a portion of supplied by a capillary 213 as needed. The wedge bonding device 200 typically includes a control module 230 configured to run software and change operating conditions and parameters prior to and during use. The apparatus can also include a viewing station 204 that enables viewing and can be used to assist in adjusting, and positioning of bonding module 210.

The wedge bonding module 210 typically includes a control arm 211 that can include an ultrasonic head (not shown in this view) with a capillary 213 used as a bonding tool mounted on a distal end thereon. The module 210 can include a linear motor (not shown) that drives the capillary 213 and bonding arm 211 (as can optionally move the deflector module 220) in the vertical direction, that is, in the Z-direction. The linear motor is but one of many examples of a suitable motive device that can be used to accomplish the desired movement in the module 210. This Z-axis movement enables the bond tool 213 to apply wire to various locations on the substrate 202. An XY table 214 is used as an XY positioning unit that holds the bonding module 210 (including control arm 211, bonding capillary 213, deflector module 220, and image pickup unit 204) and moves the module two-dimensionally a substantially horizontally arranged X-direction and Y-direction, and positions the same capillary 213 for wire bonding.

The control module 230 can include one or more microprocessors for controlling the entire wire bonding apparatus 210. For example, a drive device 231 can provide control signals to the bonding head 213 and the XY table 214 in response to a command signal from a controller 232. Commonly, software (or firmware) is executed on a microprocessor of the controller 232 and the operation of wire bonding or the like is performed by implementing the program. A support 205 holds the IC device 202 so that it can be wire bonded to another substrate. In this depicted embodiment, the other substrate comprises a lead frame 203. Additionally, in some embodiments, the support can include a heater unit. In one implementation, the semiconductor chip 202 is mounted on a lead frame 203 which can be mounted on the heater plate of a heater unit at the top of the support 205. The lead frame 203 can be heated by the heater unit.

Also, the wire bonding apparatus 200 typically includes an operation panel 233 having, for example, data input features that can include, but are not limited to track balls, alphanumeric value entering keys, and operating switches for enabling input and output of data such as process parameters and further display of the data for operation of the device 200. Such data can be input into the controller 232 to, for example using a track ball, enable manual movement of the XY table 214. The control unit 232 and the operation panel 233 are collectively referred to as an operating unit, hereinafter. The wire bonding apparatus 200 can be operated manually or automatically by the operation of the operating unit.

The wedge bonding module 210 which drives the bonding arm 211 vertically in the Z-direction includes a position detection sensor 216 for detecting the position of the bonding arm 211, and the position detection sensor 216 is adapted to output the position of the capillary 213 mounted to the distal end of the bonding arm 211 from the position of a preset original point of the bonding arm 211 to the control device 232. The linear motor of the wedge bonding module 210 drives the bonding arm vertically in response to instructions from the controller 232 which also controls the magnitude and the duration of a load to be applied to the capillary 211 at the time of bonding.

Additionally, an ultrasonic oscillator (not shown) can be located within the arm 211 which, in one embodiment, can use a piezoelectric transducer to cause the capillary 213 to generate the requisite ultrasonic oscillations that can be applied to the capillary 213, for example, upon reception of a control signal from the controller 232.

Additionally, the controller 232 provides signals to the deflector module 220 that enable it to deflect wire extruded from the capillary 213 in accord with certain aspects of the invention. This will be discussed in greater detail in the following paragraphs.

In general, the wire bonding apparatus 200 is configured to connect bond pads of the IC device 202 to external bonding sites, for example, bonding sites on a lead frame 203. These bond connections are made using bond wire such as aluminum wire. Also, gold and copper can be used in accord with this invention. Aluminum being attractive because it is a softer material than both copper and gold thus reducing stress on the underlying substrate (the die 202) during wedge bonding. The approach disclosed in this application has several advantages over prior art methods. Unlike ball bonding, the present invention can be practiced at room temperature thus removing a large array of heat related problems from the system. Additionally, the need for non-oxygen ambient is also removed from the system. Also, it provides a high-speed method for achieving wedge bonding which has been a slow process for over 30 years. Thus, this invention meets a long unmet need and is particularly advantageous when used with materials like aluminum bonding wires.

A novel feature of the invention includes a deflector element 220 which is position in an operational arrangement with a bonding capillary 213. Typically, but not exclusively, the deflector element 220 is mounted with the bonding arm 211. The deflector element 220 comprises a movable deflector member and an associated actuator that enables controlled motion for the movable deflector member. The motion of the movable deflector member is intended to execute x-axis and y-axis movement and bending of an extruded portion of a bond wire extending from a capillary 213.

In general, the deflector element 220 and capillary 213 are controlled by software and hardware enabling their integrated operation with the wire bonding recipe of the bonding processes executed by the apparatus 200.

Figure 3A:
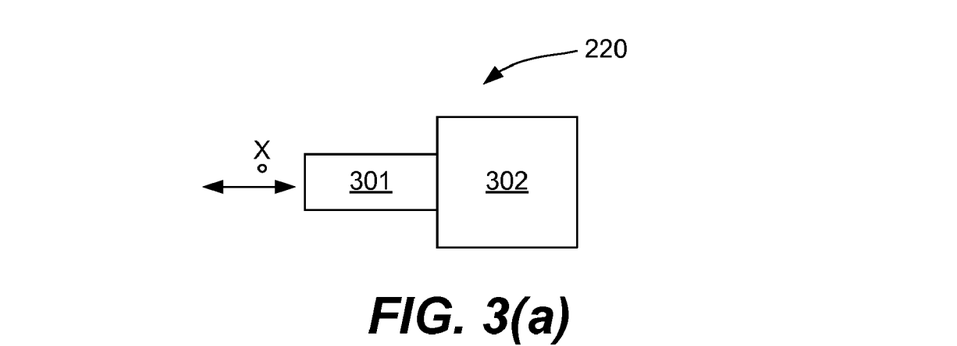
FIG. 3(a) is a block diagram illustrating an operational relationship between an inventive deflector element and associated actuator element in a deflector module in accordance with the principles of the present invention.

Such a movable deflector member can comprise one or more separate elements configured alone or in combination to enable such x, y movement and bending in a bond wire. The actuator can comprise a drive motor(s), magnetic actuators, and other motive elements. FIG. 3(a) is a block diagram schematically illustrating an embodiment of a deflector element 220. In particular there is a movable deflector member 301 and an associated actuator system 302.

Figure 3B:
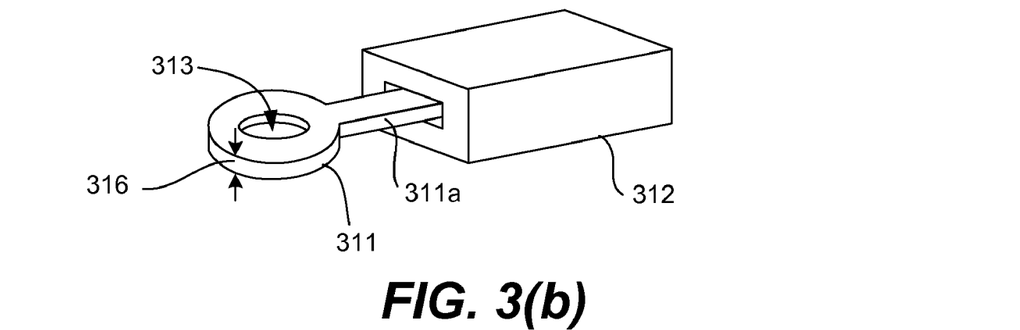
FIG. 3(b) is illustration of a specific embodiment of a deflector module in accordance with the principles of the present invention.

FIG. 3(b) is a diagrammatic depiction schematically illustrating an embodiment of a deflector element 220. In particular there is a movable deflector member 311 and an associated actuator system 312. In this particular embodiment, the member 311 includes an aperture 313 used to manipulate the position of the bond wire. In such case the bond wire is deflected by the inner surfaces of the aperture 313. For example, the aperture 313 is made in a working end of a deflector wand 311 that includes an arm portion 311a used to engage the working end with the actuator 312. The actuator system can comprise any system of motive devices suitable for moving the deflector member (or wand) 311 in the desired directions.

Figure 3C:
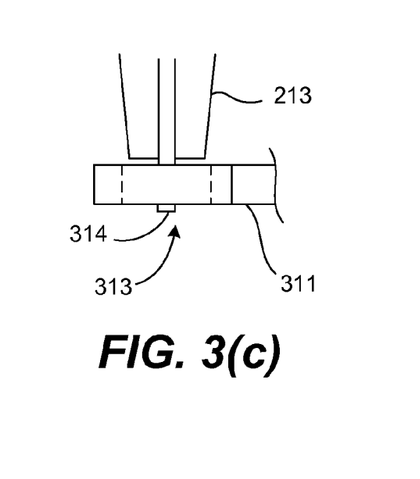
FIGS. 3(c)-3(e) are a set of illustrations depicting a method embodiment of using selected embodiments of a deflector module to position and deflect a wire bond wire in accordance with the principles of the present invention.
Figure 3D:
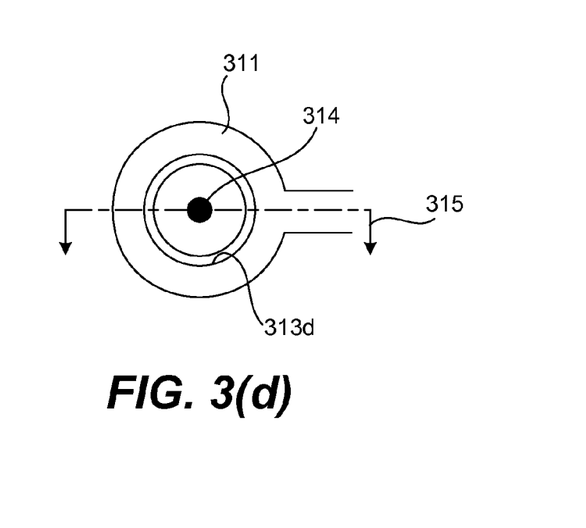

FIGS. 3(c) & 3(d) are diagrammatic depictions of the deflector member 311 embodiment such as shown in FIG. 3(b). The aperture 313 has a diameter that is greater than a diameter of an associated capillary 213. One example of a set of ranges for capillary outer diameter is on the order of about 2-100 mils. Such ranges are very flexible and depend largely on the size of the bonding wires and bonding pads (or other contacts) used. A complementary aperture 313 has a larger aperture. In one embodiment, the aperture can range from about 10-25% larger than the capillary diameter. For example, an aperture diameter for a 10 mil diameter capillary is on the order of about 11-13 mils. In one example, a capillary has an outer diameter of about 30 mils, with an associated deflector inner diameter of about 40 mils. Referring back to FIG. 3(b), in one example the thickness of the deflector 311 can be on the order of about 4-30 mils. It should be specifically pointed out that although specific dimensions are identified, a considerably larger range of dimensions, shapes, and configurations are expressly contemplated by this patent. Additionally, such deflector members can be made using a number of different materials or combinations of materials. In one example, the deflector member 311 can be made of a tungsten material.

FIG. 3(d) is a bottom up view of an example embodiment. The aperture 313 of the deflector member 311 includes an inner surface 313d that can operatively deflect the bond wire 314. Also, the cross-section 315 of FIG. 3(d) is used to describe the process illustrated in FIG. 4.

Figure 3E:
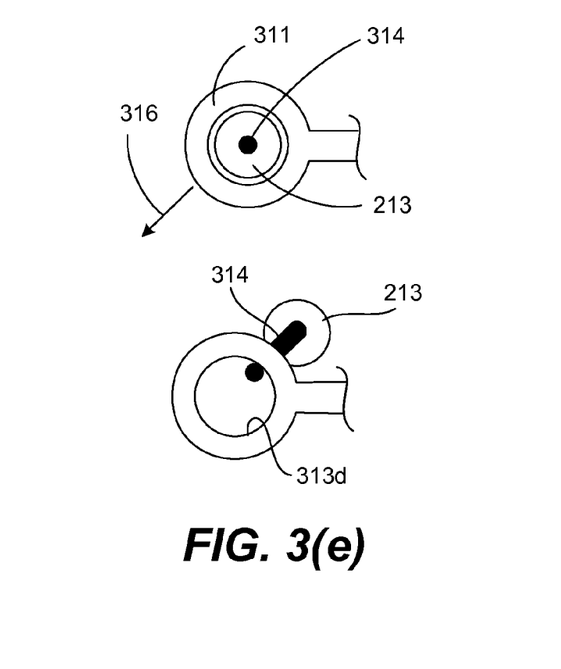

FIG. 3(e) is a simplified view (as in FIG. 3(d)) of an example embodiment showing deflection of a wire 314. The deflector member 311 moves in an arbitrary direction 316, shown here as having an x-component and a y-component. Importantly, the wire 314 is deflected by a surface of the inner wall of the aperture 313d. Thus, the wire 314 is bent and orient in a desired direction. Importantly, the orientation of the capillary 213 does not change (in an x, y direction) to accommodate changing angles of the bent bond wire. The capillary 213 maintains the same orientation regardless of bond angle (or wire angle) in the bent bonding wire.

It is particularly pointed out that the deflection of the wire 314 is achieved by the relative motion of the wire with respect to the deflector 311. In other words, it can be that the capillary 213 itself is moved relative to a stationary deflector 311.

FIGS. 4(a)-4(g) illustrate an implementation of a process used to establish a high speed wedge bond.

Figure 4A:
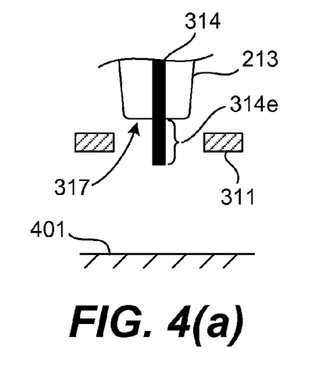

FIG. 4(a) shows a capillary 213 in position above a bond pad 401 preparatory to bonding a wire 314 to the pad. This view is similar to the cross-section axis 315 shown in FIG. 3(d). In this embodiment, a deflector member 311 is in position to deflect an extruded portion 314e of a bonding wire 314 extending from a capillary.

In one feature of the invention, the facing surface of the capillary 317 is a substantially flat surface. The surface 317 generally having a face angle of in the range of about 0-4°. This is important because it is desirable to have the greatest amount of surface area of the facing surface applied against a bend bonding wire.

In describing the process, the capillary 213 is positioned above the desired bonding site 401, a portion of wire 314e is extruded from the wire in a desired length. For example, the length 314e is on the order of a radius of a flat facing surface 317 of the capillary. For example, using an 8 mil diameter capillary, the extruded portion 314e can be on the order of about 3-4 mils in length. The bonding wire can be made of any material and any thickness. Gold, copper, aluminum, and allots of the same provide some examples of suitable materials. Such wires are on the order of 15 μm-to 2 mil as well as other thicknesses. In one example, a capillary 213 extrudes a portion of a bond wire 314e a desired length through the aperture 313 and then fixed in length. For example, the wire can be extruded through an open wire clamp to the desired length, then the wire clamp fixes the wire in place (stabilizing the length) and then relative movement of the deflector and capillary bend the wire as appropriate.

Figure 4B:
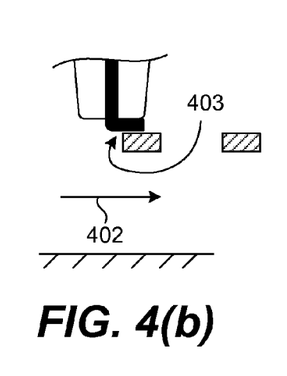

The bond angle required to connect the bond pad 401 to a desired external bonding site is determined. This enables the correct x, y deflection to be applied to the bent portion of the wire 403. Then, as shown in FIG. 4(b), the deflector 311 is moved in direction 402 that bends the extruded wire portion 314e in the desired direction to form a bent wire portion 403 oriented in a desired direction.

Figure 4C:
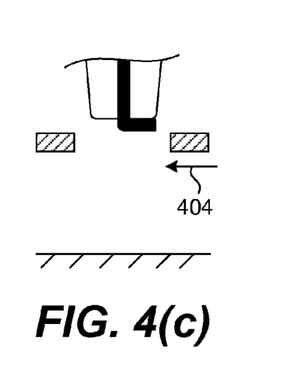

After bending, as shown in FIG. 4(c), the deflector 311 is moved back 404 into a centered position (centered on the capillary 213).

Figure 4D:
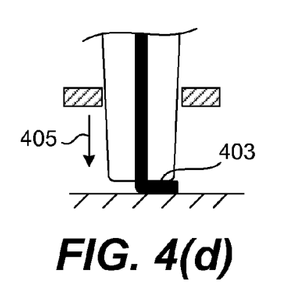
Figure 4E:
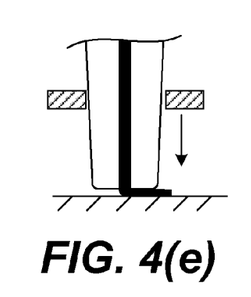

Then, as shown in FIG. 4(d), the capillary 213 is stamped downward 405 into the bonding site 401 such that the bent wire 403 is compressed (See, FIG. 4(e)) between the facing surface 317 of the capillary 213 and the surface of the bond pad 401. One advantage of using aluminum wire is that aluminum is softer than gold and copper. Relative to gold, this means that the downward force applied to an aluminum wire and bond pad 401 is less than half the pressure applied to a similar diameter gold wire. This places a good deal less stress on the underlying semiconductor device. This lack of stress is particularly advantageous in that it substantially reduces stress induced damage in the underlying devices.

Thus, as is shown in FIG. 4(e) the stamping process compresses the bent portion of bond wire. Additionally, to establish a solid bond ultrasonic energy is applied to the wire to ultrasonically bond 314b the wire to the bond pad 401.

Figure 4F:
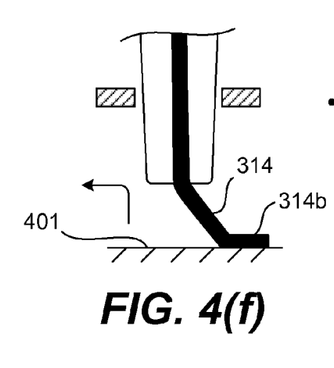

Once bonded, as shown in FIG. 4(f), the wire 314 is lifted away from the wedge bond 314b and moved to the complementary bonding site (e.g., on an associated lead frame). Once, the capillary is moved to the complementary bonding site a second wedge bond is made and then the wire 314 is broken off. The capillary 213 is retracted back upward through the deflector aperture 313 (See, FIG. 4(g)). The capillary is also moved to a next bond pad and a new length of wire 314e is extruded for bonding to the second bond pad. The illustrated process is repeated again and again until a desired number of wire bonds are made with the die substrate.

Additionally, when the wire portion 403 (314e) is bent in direction 402 (See, e.g., FIG. 4(b)) the direction of deflector 311 movement 402 is generally aligned to facilitate a direct connection between the subject bond site (bond pad 401) and the desired target bond site (e.g., the lead frame attachment point). For example, with reference to FIG. 4(h) a bond pad 111 is positioned in an example arrangement with an associated connector 115 (e.g., a portion of a lead frame) onto which a second bond site is located and a second wire bond is to be made. A bond wire 116 is bent in an appropriate direction (as shown) generally aligned with a direct line to the second bond site 115. The bond angle 117 can change for each wire bond connection between first site (e.g., 111) and second associated bond site (e.g., 115) as a wire bonding process is executed around an integrated circuit die. The methods and devices described herein are flexible and robust enabling a 360° change in bond angles. Advantageously, the disclosed embodiments do not require any change in rotational bond head configuration as the process proceeds around the circumference of the die. This allows the process to continue with no rotational adjustment of the bond head (the capillary) as it moves from wire bond to wire bond to wire bond. This eliminates the constant readjustments required of prior art wedge bonding tools as they move from wire bond to wire bond. Thus, it is far faster than these tools, having bond rate similar to that of ball bonding tools and processes. This has been a major jump forward solving a 30 year old problem and will likely find broad wedge bonding application across the entire semiconductor industry.

It is pointed out that the wire can be positioned and held in place using standard clamp and wire tensioners as can be found in ball bonding tools. The clamp holds the wire in place while the deflector bends the wire into the desired configuration and then releases the wire once it is positioned at the desired bonding site. Moreover, in some embodiments the wire tensioner (or other associated vacuum systems) can be dispensed with altogether.

Figure 5A:
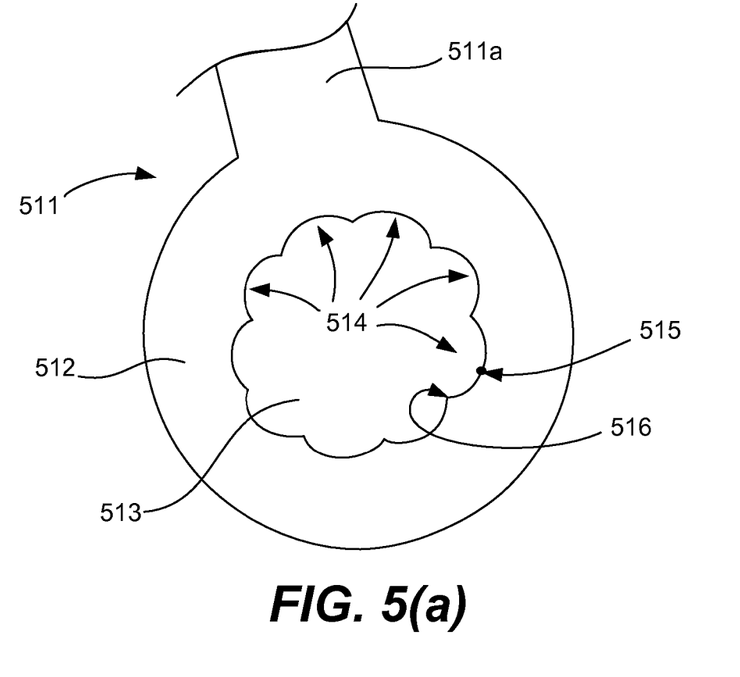
FIGS. 5(a) and 5(b) show an example embodiment of deflector element and aperture in accord with one example embodiment of the invention.

FIG. 5(a) shows another embodiment of a deflector aperture. In this depiction, a deflector arm 511a supports a working end 512 of a deflector element 511. In particular, a different embodiment of aperture is shown. The aperture 513 comprises a flower-shaped aperture 513 arranged with a plurality of wire guiding features 514. The inner surface of the aperture 513 is shaped generally like a "flower" having petal portions. These petal portions 514 are the guide features 514. They are arranged such that when the aperture is moved across (402) the extruded wire (e.g., 314e) the wire can be generally centered at a nadir 515 of one of the features 514. Importantly, the presence of apexes 516 between the petals can prevent the wire from deviating from one petal to another as the deflector moves across the capillary. As shown in this embodiment, the aperture 513 includes 8 "petals" that serve as the guide features 514. Different embodiments can, of course, have more or fewer petals. Also, a wide range of petal shapes or configurations can be employed as might be suggested to one of ordinary skill by this disclosure.

Figure 5B:
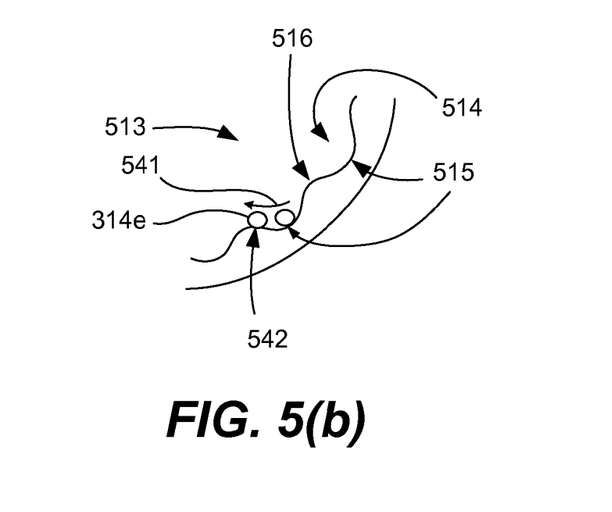

An example depiction of the operation of a guide feature 514 is shown with reference to FIG. 5(b) which shows a portion of an aperture of one possible embodiment of a deflector element 511. As shown here each of the petals 514 has a curvature defining a nadir 515 portion located at the sidewall of the aperture 513 for each petal 514. Moreover, separations between petals 514 are defined at each petal end by an apex feature 516. In one example bending operation, as the deflection aperture 513 begins to deflect an extruded length of wire 314e, the wire 314e may attempt to move or bend in an undesirable direction. To assist in keeping the wire 314e on track, the shape of the guide feature 514 guides the wire 314e into a more desirable location to achieve bending at a desired angle. In one embodiment, each petal 514 can have a curvature with outer nadir 515 and a series of apex features 516 separating the petals 514. Thus, during bending the wire 314e is caught with one of the guide features 514 (for example at a starting position 540 wherein during the bending operation the wire 314e slides (e.g., in direction 541) to a desired position 542. In particular, the apexes 516 can serve as restraining members (516) between the petals 514 prevent free motion of the wire 314e from petal to petal, thereby working to restrain the radial motion of the wire 314e as it is bent. This assists the deflector element 511 in correctly aligning the bent wire during use.

It is specifically pointed out that many different implementations of such guide features can be used. For example, the inner surface of the aperture can comprise a set of slots or grooves in the inner surface to engage and fix the wire during wire bonding. In one example implementation a series of notches can be arranged in a spaced apart arrangement around the inner surface of the aperture. For example, the spacing can be such that grooves are spaced every 5°, 4°, 3°, 2°, 1°, or even tighter. It is pointed out that these intervals are examples only and that the invention is not limited to these intervals with those of ordinary skill appreciating that the spacing can be set at any desired interval. It is also pointed out, that alignment features can also be arranged on the capillaries. However, the inventors note that it is advantageous to place them on the deflector element. This is because the formation of the guide features is time consuming and difficult. Additionally, the lifespan of an average capillary is considerably less than that of a deflector. Thus, although the invention contemplates the placement of alignment features on the capillaries and/or the deflector element 511, there are certain advantages to placing them on the longer lived deflector element.

In a continuing description of the invention one method of applying this technology is described. In one embodiment, a method of employing a wire bonding apparatus 200 in accordance with an aspect of the invention is described. This embodiment describes a wedge bonding method and associated method of establishing wire bonds between bond sites. An aspect of this invention will be discussed in association with the embodiment addressed in the flow diagram of FIG. 6.

Once the die (or other target subject) is positioned on the inventive wedge bonding tool bonding can begin. It is to be noted that appropriate adjustments and software instructions can be applied to the tool 200.

Figure 6:
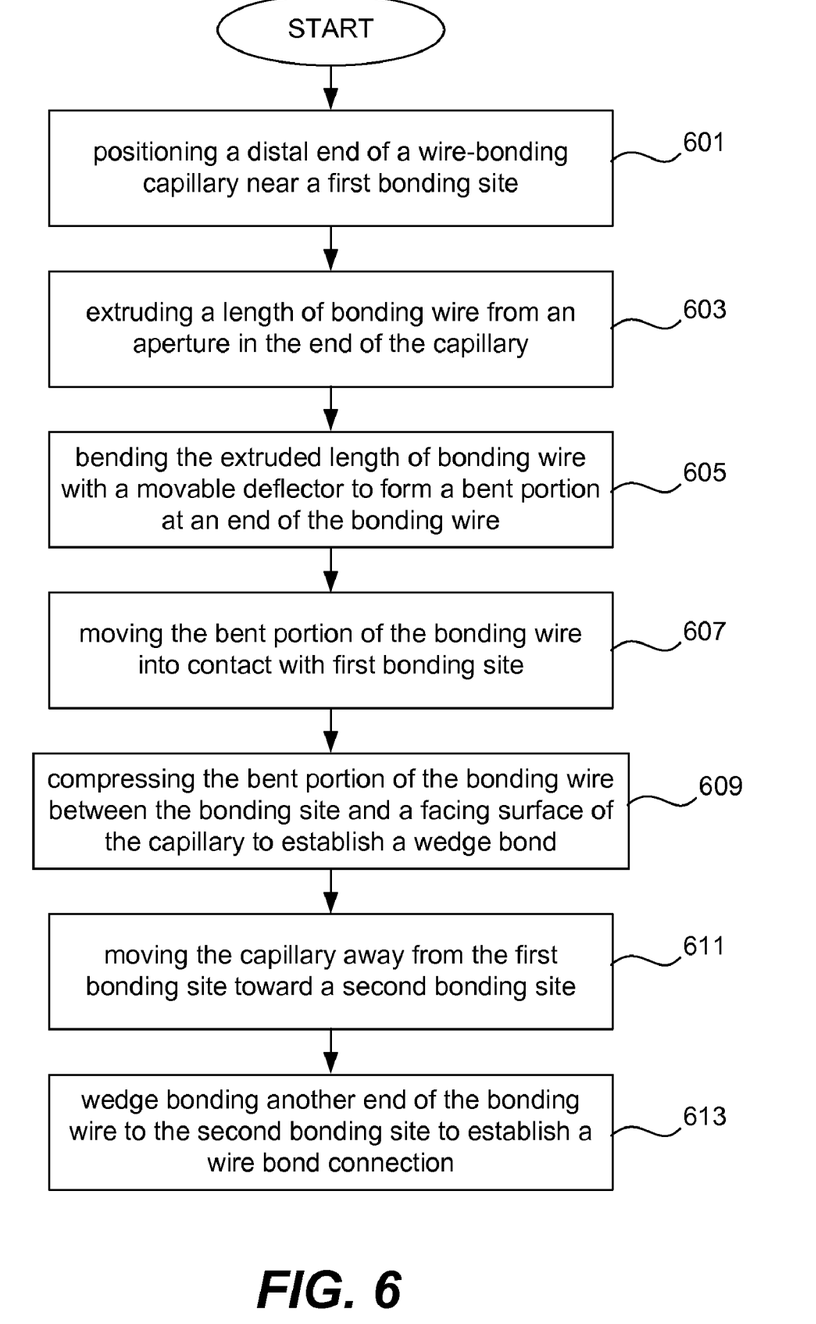
FIG. 6 is a flow diagram illustrating one approach to implementing wedge bonding in accordance with the principles of the invention.

Accordingly, the distal end of a wire-bonding capillary is positioned near a first bonding site (Step 601). The capillary supports a bonding wire and can have an entire strand of appropriate wire in readiness for a bonding process. The wire can be of any material, with aluminum, copper, and even gold providing attractive materials. Aluminum in particular provides some process advantages. In particular, aluminum is soft and also aluminum is compatible with many bond pad and bonding site materials (e.g., copper). Accordingly, it is not necessary to plate the target bond pads to obtain good bond adhesion between wire and pad as is the case with some other materials (e.g., gold). Generally, such positioning involved positioning the capillary right above the bond site. The capillary head must be positioned above the bond pad a distance that is thicker (e.g., 316) than the thickness (height) of the associated deflector arm (e.g., 311). Thus, for a deflector arm 30 mils thick, the capillary head will be at least 35 mil and possibly much higher above the bond pad. In one example implementation the capillary head (the tip of the capillary) is positioned about 50 mils above the target surface (the bond site) in readiness for bonding. In general, the capillary head is a distance above the bond pad that takes into consideration the height of the deflector above the bond pad, the thickness of the deflector, the thickness of the wire, and any desired tolerances.

A length of wire is extruded from the aperture in the end of the capillary (Step 603). In one implementation, a bond wire is fed down through an inner diameter of the capillary to extend a distance beyond a facing surface of the capillary. The extruded length can be on the order of about the radius of the capillary face. Thus, for a capillary having a diameter of about 6 mils, an extruded length of up to 3-4 mils can be used. It is pointed out that greater or shorter extruded lengths can be used. In particular, for greater diameter capillaries greater lengths can be used and vice versa. As mentioned above, aluminum, copper, gold and other materials can be used with aluminum being a particularly attractive candidate. Additionally, a wide range of wire thicknesses can be employed with this methodology. One example range of wire thicknesses can include wire diameters ranging from about 5 µm to about 2 mils and other thicknesses. One example can be a 50 µm aluminum wire extruded to a length of about 3 mils using a capillary having a diameter of about 6 mils. Of course this is but one example with many others apparent to those of ordinary skill.

Once the desired length of wire is extruded, a movable deflector is imposed against the extruded length of bonding wire to bend the bonding wire to form a bent portion at an end of the bonding wire (Step 605). A deflector (for example, a deflector 311 as is shown in FIGS. 4(a)-4(g)) is brushed under the extruded portion of wire (for example, the wire 314e of FIGS. 4(a)-4(g)) bending the wire against the bottom face of the capillary (for example, capillary 213 of FIGS. 4(a)-4(g)) to form the bent portion of the wire (for example, bent wire 403 of FIGS. 4(a)-4(g)). Importantly, as already discussed, the deflector bends the wire to attain the desired orientation (bond angle) relative to the associated second bond site to which the wire is to be connected in the wire bonding process.

Additionally, the bending process requires that the deflector pass beneath the capillary. For example, in one embodiment the facing surface of the capillary can lie a distance of about 1.1 to about 1.5 wire diameters above the top surface of the deflector 311. Of course, the distance can be less or greater. The general idea being that the desired amount of bend is imparted to the bent portion of wire 403 by the motion of the deflector under the capillary.

Once bent, the deflector is repositioned such that the capillary can pass through the aperture of the deflector. Then the capillary is moved through the aperture toward the bonding site such that the bent portion of the bonding wire is moved into contact with the first bonding site (Step 607). Additionally, the facing surface of the capillary compresses the bent portion of the bonding wire between the bonding site and a facing surface of the capillary to establish a wedge bond of the bonding wire with the first bonding site (Step 609). This process is typically enhanced using ultrasonic energy. For example ultrasonic bonding or scrubbing can enhance the bond between the wire and bonding surface. Also, in some embodiments thermosonic bonding can be used enhance the bond between the wire and bonding surface. This will be discussed in some detail below with respect to certain capillary heads. This process results in a low temperature wedge bond that can be established in any direction without need for changing the rotational orientation of the capillary. This first novel aspect of this embodiment is completed in the formation of this novel type of wedge bond.

Once the bond is established, the method can move the bonding wire to a second bonding site to establish a completed wire bond electrical connection with another circuit element. For example, the capillary is moved away from the first bonding site (the location of the first bond) toward a second bonding site (where the bond that completes the connection can be made) (Step 611). Once in the desired location the capillary is positioned operative arrangement with the second bonding site and the wire is wedge bonded to the second bonding site to establish a wire bond connection between the first and second bonding sites (Step 613). A standard wedge bonding technique can be used here and the wire can be broken off in a standard fashion to complete the bond. At this point the capillary can be removed to another bonding site to repeat the process. Importantly, the rotational orientation of the capillary is not changed in this move.

Figure 7A:
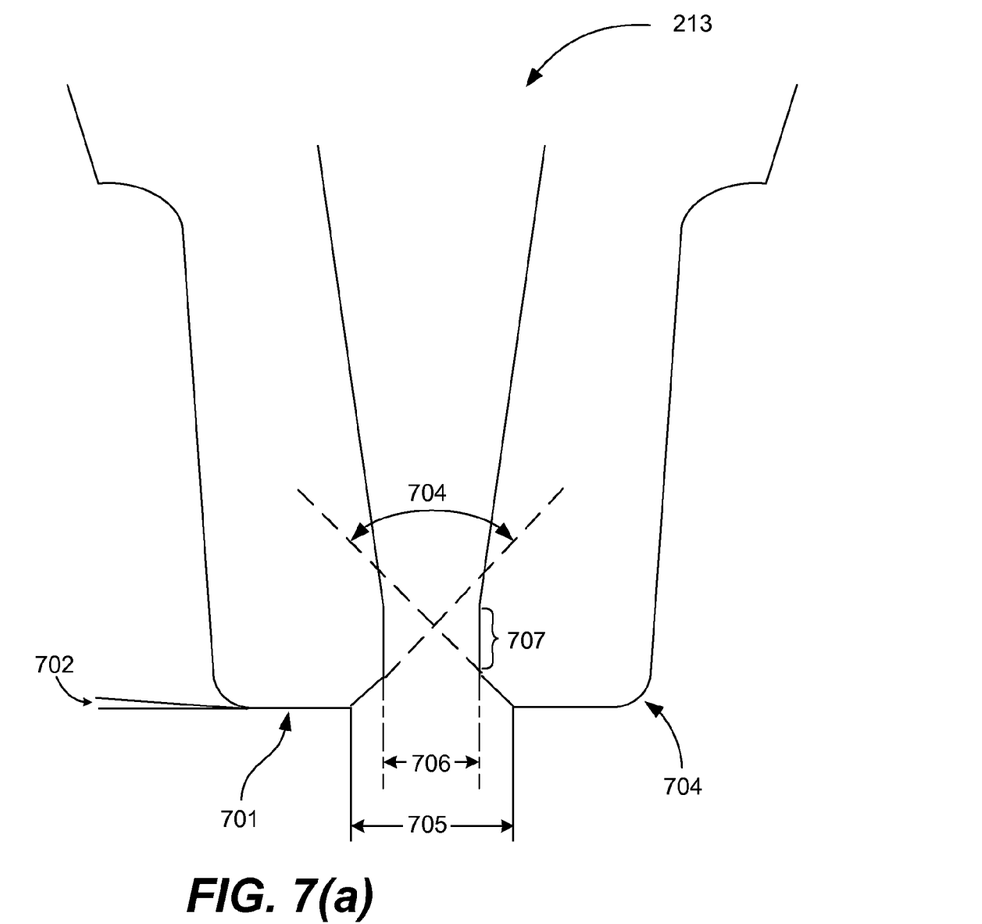
FIGS. 7(a)-7(d) illustrate some aspects of selected wedge bonding capillary embodiments suitable for employment in accordance with the principles of the invention.

FIG. 7(a) is a cross-section view of one example of a capillary device 213 suitable for use with some embodiments described in this specification. The capillary 213 can be made of any material. But when used with aluminum wire, a hard material like aluminum oxide crystals (ruby, sapphire, etc.) can provide an excellent capillary material. In aluminum applications such materials are harder than aluminum oxide materials that sometimes form on bond wires. Such oxides are damaging to prior art ceramic capillaries. And such ruby materials also suffer from less aluminum build up. Additionally, similar advantages can be obtained with tungsten carbide capillary materials. It is pointed out that this technology has applicability beyond aluminum wedge bonding and can be used with copper, gold, silvers, their alloys as well as various other materials. In addition to the materials described above, in some implementations capillaries formed of ceramics (e.g., Zirconar ceramic and others) can also be used/

In one important attribute, the face surface 701 of the capillary is flat or very near flat. The face angle 702 (not drawn to scale) that describes an angle that the facing surface 701 makes with a perfectly flat plane should be less than about 4-5°. This very flat surface enables a maximum contact area of the surface 701 with the bent wire. Additional implementations can include faces with slight inverse angles (those having surfaces that become higher as they extend inward from the face edges). In general, these more flat surfaces are very different from capillaries used to ball bond gold wires. Such ball bonding capillaries are designed to optimize ball formation. Accordingly, they have relatively steep face angles. In a typical gold ball bonding application the face angle will be 8°, 12°, 15°, or even steeper. These tools cannot provide the needed contact area required to enable the present methodology. Additionally, when using gold processes, the facing surface 701 is very smooth. However, in an aluminum bonding capillary, a great deal of "scrubbing" is required to break up the surface oxides present on aluminum wires. Hence a rough surface is required. This is amplified through the effect of ultrasonic scrubbing. Such a roughened matte surface can be used with a ruby or tungsten carbide capillary.

Figure 7B:
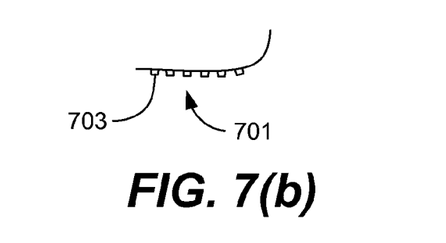

It is also noted that a pattern of raised features can be used to good effect in this manner. For example a criss-crossed (cross-hatched) pattern of raised features (e.g., a waffle-shaped pattern) can provide good results. FIG. 7(b) is a side-section view of a facing surface 701 having a number of raised features 703. Such a pattern is particularly useful when used with tungsten carbide capillaries. For example, in the embodiment shown, the pattern of features 703 can comprise a series of ridges that are spaced and sized at dimensions that are dependent on the diameter of wire used. For example, the ridges can be spaced a distance about 10-25% of the wire diameter, on center, and can have a height of about 10-25% of the wire diameter, width a ridge width of on the order of about 4-15% of the wire diameter. For example, when applied to a 1 mil wire, example features can include ridges spaced apart by about 0.20 mils, with a height of about 0.20 mils, and being about 0.05 mils wide. It will be readily appreciated that smaller feature dimensions as well as larger can be used.

Figure 7C:
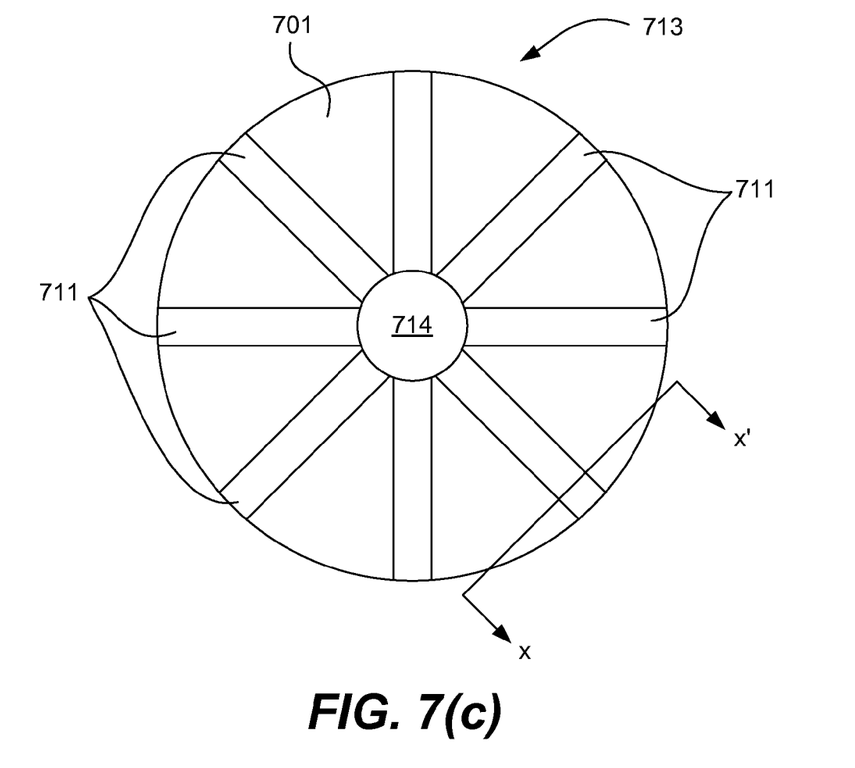
Figure 7D:
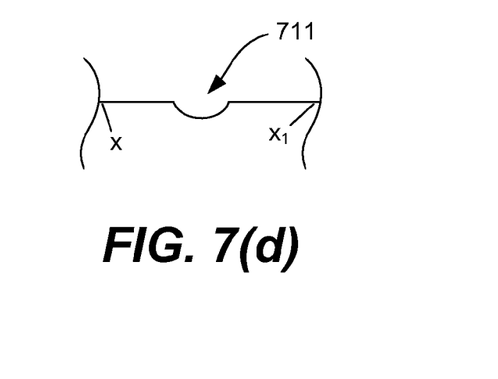

In another embodiment, FIGS. 7(c) and 7(d) depict a facing surface (e.g., 701) of another capillary 713 facing surface 701. The facing surface 701 includes a series of guide features formed in the facing surface 701. As shown here, the guide features comprise positioning grooves 711 arranged in the facing surface 701. The grooves 711 are configured to aid in the position of bonding wires as the wired will slide into the grooves during bonding making the wire positioning more secure and precise. In the depicted embodiment, the grooves 711 are arranged like spokes around a centralized aperture 714 through which the extruded wire is supplied for wire bonding. Depending on the needs of the user more (or less) spokes can be employed.

Referring to side section view of FIG. 7(d), the seating grooves can be configured having shallow or deep depths. Preferred embodiments are arranged with the depth of seating grooves 711 being in the range of about 25-405 of the thickness of the wire used. In one example, a 15 μm wire can have a groove 711 depth of on the order of about 5 μm. The idea being that a wire will slide into the groove, during bonding, and prevented from further substantial radial movement once lodged in the groove 711. As for the remaining portions of the surface, they can be smooth or roughened depending on the needs of the user.

Returning to a discussion of FIG. 7(a), the outer edges 704 of the capillary are also different from known geometries. This difference is intended to provide a larger surface area for contacting the wire. Thus, a radius of curvature for the outer edge 704 of the capillary is much less than that used for a gold ball bonder. For example, in the present invention, the radius of curvature for the outer edge 704 is on the order of 12 μm or less. This, radius is very small as compared with the 20 μm or greater radii commonly found in gold ball bonding capillaries.

Additionally, the chamfer angle in the present capillary is steeper than that of an ordinary ball bond capillary. This can be characterized by the interior chamfer angle (ICA) depicted in FIG. 7(a) as ICA 704. In a suitable embodiment used for the wedge bonding applications described here, angles in the range of about 0° to about 120° can be suitable. With angles of 70° of less being preferred in some implementations. This enables a tighter chamfer and thereby increases the surface area of the facing surface 701. In this application, a chamfer diameter 705 is about 1.5 times the diameter of the bond wire used. Additionally, the bore diameter 706 is sized to be in the range of about 6-10 μm more than the diameter of the bond wire used. However, in some implementations the outer chamfer diameter 705 may be arranged only slightly larger or of the same diameter as that of the bore 706. Another feature is a bore length 707 that defines a length of the bore shaft that is vertical walled to enable the wire to remain straight as the deflector bends the wire. In one implementation this is one the order of about 1-2× the bond wire diameter. It is pointed out that this is just one example implementation and is not the only way such a capillary can be formed. In one embodiment, it is important that the facing surface be flat (or nearly so), that the facing surface have a roughened or patterned surface rather than a smooth face, and that the facing surface be generally round (a typical facing surface being shown for 213 in FIG. 3).

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated.

It is intended that the scope of the invention be defined by the following claims and their equivalents.

What is claimed is:

1. A wire bonding apparatus comprising:
a support for holding wire bonding substrates;
a wire bonding capillary with an opening for carrying and extruding a bonding wire and enabling wire bonding to the wire bonding substrates;
a movable deflector member arranged to move generally adjacent to a facing surface of the capillary enabling the deflector member to bend an extruded length of bonding wire such that the bent extruded length of bonding wire can be articulated at different bond line angles while maintaining a constant rotational orientation for the capillary;
wherein the movable deflector member having an aperture having a center with an inner surface of the aperture arranged concentrically about the center further including a plurality of wire guide features to assist positioning of the extruded length of bonding wire wherein a first wire guide feature comprises a recessed portion that lies a greater radial distance from the center of the aperture than a remaining portion of the inner surface of the aperture; and
a controller configured to enable operational control of the wire bonding apparatus.

2. The wire bonding apparatus of claim 1 wherein,
the movable deflector member moves generally horizontally across the facing surface of the capillary to bend the bonding wire so that the bent extruded length of bonding wire extends substantially parallel to a plane of the facing surface of the capillary.

3. The wire bonding apparatus of claim 1 wherein,
the wire bonding capillary includes an outer diameter;
the movable deflector member comprises an aperture having a diameter that is greater than the outer diameter of the of the wire bonding capillary, and
the wire bonding capillary and the movable deflector member are arranged to enable the capillary to move downward through the aperture in the movable deflector member to contact the bent extruded length of bonding wire with a bonding site of the wire bonding substrate positioned on a table.

4. The wire bonding apparatus of claim 1 wherein the plurality of wire guide features are arranged on the inner surface of the aperture of the movable deflector member in a flower-shaped pattern.

5. The wire bonding apparatus of claim 4 wherein the flower-shaped pattern comprises 8 wire guide features.

6. The wire bonding apparatus of claim 1 wherein the capillary facing surface is configured to compress the bent extruded length of bonding wire between a bonding site of the wire bonding substrate and the facing surface as the capillary compresses the bent extruded length of bonding wire between the bonding site and the capillary facing surface.

7. The wire bonding apparatus of claim 1 wherein the capillary facing surface is for compressing the bent extruded length of bonding wire against a bonding site of the wire bonding substrate during wedge bonding.

8. The wire boding apparatus of claim 7 wherein the capillary facing surface is substantially perpendicular to the opening of the capillary in the range of about 0° to about 4°.

9. The wire bonding apparatus of claim 8 wherein the capillary facing surface has a plurality guide features formed thereon.

10. The wire bonding apparatus of claim 1 wherein the apparatus enables a bonding rate of at least five bonds per second.

11. The wire bonding apparatus of claim 10 wherein the apparatus enables a bonding rate of at least twelve bonds per second.

12. The wire bonding apparatus of claim 3 wherein the apparatus include an x,y motorized table controllable by the controller and configured to move the deflector member such that the bent extruded length of bonding wire is articulated in a pattern of predetermined bond line angles.

13. The wire bonding apparatus of claim 1 wherein the apparatus further includes an ultrasonic bonding module for enabling ultrasonic bonding of the bent extruded length of bonding wire with a bonding site.

14. A movable deflector element module for use in wire bonding operations, the module comprising:
- a deflection member movable in an x axis and y axis direction, the member including an aperture oriented in a z-axis with the aperture having an inner wall that defines a wire contact surface that includes a plurality of wire guide features, the wire contact surface being arranged concentrically about a center of the aperture such that a first wire guide feature comprises a recessed portion that lies a greater radial distance from the center of the aperture than a remaining portion of the wire contact surface of the aperture;
- a deflection actuator configured to move the deflection member in said x and y axis direction; and
- a control element configured to specify x and y axis movement for the deflection actuator.

15. The movable deflector element module of claim 14 wherein the plurality of wire guide features are arranged on the inner surface of the aperture of the movable deflector member in a flower-shaped pattern.

16. The movable deflector element module of claim 15 wherein the flower-shaped pattern comprises 8 wire guide features.

* * * * *